US012628403B2

(12) United States Patent
Jiang et al.

(10) Patent No.: US 12,628,403 B2
(45) Date of Patent: May 12, 2026

(54) METHOD OF FORMING SEMICONDUCTOR STRUCTURE

(71) Applicant: NANYA TECHNOLOGY CORPORATION, New Taipei city (TW)

(72) Inventors: Pei-Rou Jiang, Tainan City (TW); Chih-Ching Lin, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 405 days.

(21) Appl. No.: 18/530,626

(22) Filed: Dec. 6, 2023

(65) Prior Publication Data

US 2025/0194204 A1 Jun. 12, 2025

(51) Int. Cl.
H10D 64/01 (2025.01)
H10P 74/00 (2026.01)

(52) U.S. Cl.
CPC ......... H10D 64/021 (2025.01); H10P 74/238 (2026.01)

(58) Field of Classification Search
CPC ............. H10P 50/60; H10P 50/66–667; H10P 50/71–73; H10P 50/26–269; H10D 64/021; H10D 64/675
See application file for complete search history.

(56) References Cited

U.S. PATENT DOCUMENTS

2011/0287625 A1* 11/2011 Kang ............... H10D 64/01326
257/E21.409

FOREIGN PATENT DOCUMENTS

KR 20200037110 A * 4/2020 ....... H01L 29/66795

* cited by examiner

*Primary Examiner* — Evan G Clinton
(74) *Attorney, Agent, or Firm* — CKC & Partners Co., LLC

(57) ABSTRACT

A method of forming a semiconductor structure includes forming a semiconductor layer and a metal layer on a first dielectric layer on a semiconductor substrate in sequence; forming a second dielectric layer on a portion of the metal layer; forming a BPSG layer on the second dielectric layer; etching the metal layer and the semiconductor layer; forming a first spacer layer on sidewalls of the semiconductor layer, the metal layer, and the second dielectric layer, and a top surface of the BPSG layer; etching the first spacer layer to expose the BPSG layer; removing the BPSG layer to expose a top surface of the second dielectric layer; forming a second spacer layer on a sidewall of the first spacer layer and the top surface of the second dielectric layer; and etching the second spacer layer to expose the top surface of the second dielectric layer.

20 Claims, 5 Drawing Sheets

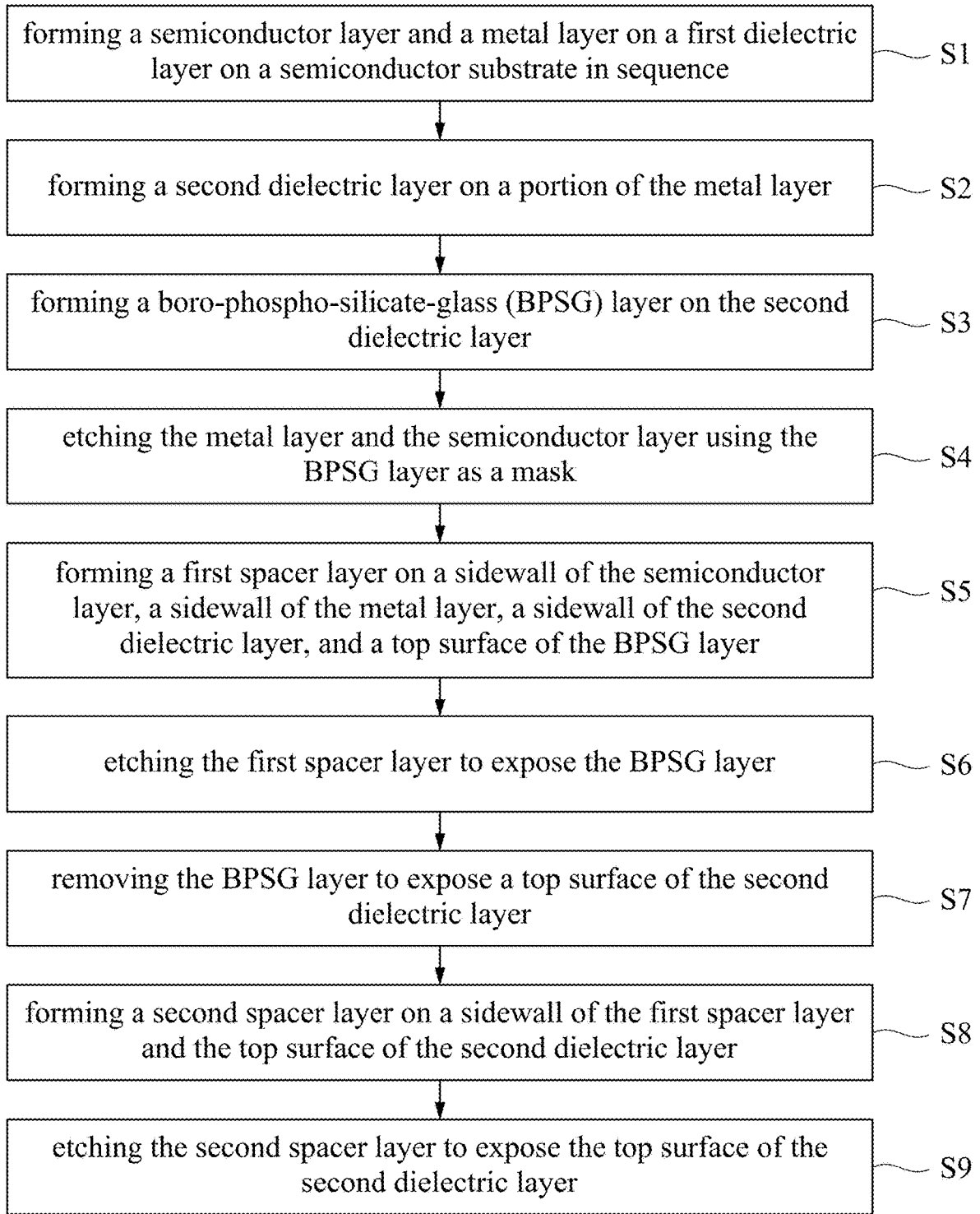

forming a semiconductor layer and a metal layer on a first dielectric layer on a semiconductor substrate in sequence ~ S1 forming a second dielectric layer on a portion of the metal layer ~ S2 forming a boro-phospho-silicate-glass (BPSG) layer on the second dielectric layer ~ S3 etching the metal layer and the semiconductor layer using the BPSG layer as a mask ~ S4 forming a first spacer layer on a sidewall of the semiconductor layer, a sidewall of the metal layer, a sidewall of the second dielectric layer, and a top surface of the BPSG layer ~ S5 etching the first spacer layer to expose the BPSG layer ~ S6 removing the BPSG layer to expose a top surface of the second dielectric layer ~ S7 forming a second spacer layer on a sidewall of the first spacer layer and the top surface of the second dielectric layer ~ S8 etching the second spacer layer to expose the top surface of the second dielectric layer ~ S9

Fig. 1

METHOD OF FORMING SEMICONDUCTOR STRUCTURE

BACKGROUND

Field of Invention

The present disclosure relates to a method of forming a semiconductor structure.

Description of Related Art

Metal-oxide-semiconductor field-effect transistors (MOS-FETs) are commonly used in memory devices, including dynamic random access memory (DRAM) devices. A MOS-FET is typically formed by providing a gate structure on a semiconductor substrate to define a channel region, and by forming source and drain regions on opposing sides of the channel region.

In general, the formation of a typical gate structure may include forming a stack that includes a polysilicon layer, a metal layer, a nitride layer, and a top oxide layer; etching the polysilicon layer and the metal layer to form a gate stack using the top oxide layer as a mask; forming a nitride spacer on the sidewall of the gate stack; and forming an oxide spacer layer to cover the nitride spacer and the top oxide layer. Thereafter, the oxide spacer layer is etched to form an oxide spacer until the nitride layer is exposed. However, the remaining top oxide layer on the nitride layer and the oxide spacer layer have the same material (i.e., oxide), and thus the thickness of the remaining top oxide layer will affect end point detection (EPD) for controlling etching process time. As a result, the thickness of the oxide spacer is difficultly controlled due to the remaining top oxide layer, thereby causing unstable positions for source/drain regions implant, which results in poor electrical properties.

SUMMARY

According to some embodiments of the present disclosure, a method of forming a semiconductor structure includes forming a semiconductor layer and a metal layer on a first dielectric layer on a semiconductor substrate in sequence; forming a second dielectric layer on a portion of the metal layer; forming a boro-phospho-silicate-glass (BPSG) layer on the second dielectric layer; etching the metal layer and the semiconductor layer using the BPSG layer as a mask; forming a first spacer layer on a sidewall of the semiconductor layer, a sidewall of the metal layer, a sidewall of the second dielectric layer, and a top surface of the BPSG layer; etching the first spacer layer to expose the BPSG layer; removing the BPSG layer to expose a top surface of the second dielectric layer; forming a second spacer layer on a sidewall of the first spacer layer and the top surface of the second dielectric layer; and etching the second spacer layer to expose the top surface of the second dielectric layer.

In some embodiments, the BPSG layer has a different etch selectivity from the first dielectric layer.

In some embodiments, a material of the first dielectric layer includes silicon dioxide, and the first dielectric layer is formed by in-situ steam generation (ISSG).

In some embodiments, the top surface of the BPSG layer is convex after etching the metal layer and the semiconductor layer.

In some embodiments, forming the second spacer layer on the sidewall of the first spacer layer and the top surface of the second dielectric layer is performed such that the second spacer layer is in direct contact with the top surface of the second dielectric layer.

In some embodiments, a material of the second dielectric layer is different from a material of the first dielectric layer.

In some embodiments, a material of the first spacer layer is different from a material of the second spacer layer.

In some embodiments, a material of the first spacer layer is the same as a material of the second dielectric layer.

In some embodiments, method of forming the semiconductor structure further includes detecting whether the top surface of the second dielectric layer is exposed during etching the second spacer layer; and stopping etching the second spacer layer when detecting the top surface of the second dielectric layer is exposed.

In some embodiments, the method of forming the semiconductor structure further includes forming a source/drain region in a position of the semiconductor substrate based on a thickness of the second spacer layer.

In some embodiments, a material of the semiconductor layer includes polysilicon.

According to some embodiments of the present disclosure, a method of forming a semiconductor structure includes etching a metal layer and a semiconductor layer below the metal layer using a boro-phospho-silicate-glass (BPSG) layer as a mask, wherein the semiconductor layer is located between the metal layer and a first dielectric layer, and a second dielectric layer is located between the BPSG layer and the metal layer; forming a first spacer layer on a sidewall of the semiconductor layer, a sidewall of the metal layer, a sidewall of the second dielectric layer, and a top surface of the BPSG layer; etching the first spacer layer to expose the BPSG layer; removing the BPSG layer to expose a top surface of the second dielectric layer, wherein the BPSG layer has a different etch selectivity from the first dielectric layer; forming a second spacer layer on a sidewall of the first spacer layer and the top surface of the second dielectric layer; and etching the second spacer layer to expose the top surface of the second dielectric layer.

In some embodiments, a material of the first dielectric layer includes silicon dioxide, and the first dielectric layer is formed by in-situ steam generation (ISSG).

In some embodiments, the top surface of the BPSG layer is convex after etching the metal layer and the semiconductor layer.

In some embodiments, forming the second spacer layer on the sidewall of the first spacer layer and the top surface of the second dielectric layer is performed such that the second spacer layer is in direct contact with the top surface of the second dielectric layer.

In some embodiments, a material of the second dielectric layer is different from a material of the first dielectric layer.

In some embodiments, a material of the first spacer layer is different from a material of the second spacer layer.

In some embodiments, a material of the first spacer layer is the same as a material of the second dielectric layer.

In some embodiments, method of forming the semiconductor structure further includes detecting whether the top surface of the second dielectric layer is exposed during etching the second spacer layer; and stopping etching the second spacer layer when detecting the top surface of the second dielectric layer is exposed.

In some embodiments, the method of forming the semiconductor structure further includes forming a source/drain region in a position of the semiconductor substrate based on a thickness of the second spacer layer.

In the aforementioned embodiments of the present disclosure, since the boro-phospho-silicate-glass (BPSG) layer is formed on the second dielectric layer to replace a traditional oxide layer, the BPSG layer can be removed to expose the top surface of the second dielectric layer after etching the first spacer layer. As a result, the second spacer layer can be directly formed on the top surface of the second dielectric layer and the sidewall of the first spacer layer. There is no additional oxide layer directly below the second spacer layer before etching the second spacer layer and having the same material as the second spacer layer, end point detection (EPD) for controlling etching process time can be stable based on the thickness of the second spacer layer. Accordingly, the thickness of the remaining second spacer layer is easily controlled, thereby defining stable positions for source/drain regions' implant, which results in good electrical properties, such as saturation current (Idsat).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method of forming a semiconductor structure according to one embodiment of the present disclosure.

DETAILED DESCRIPTION

Figure 2:
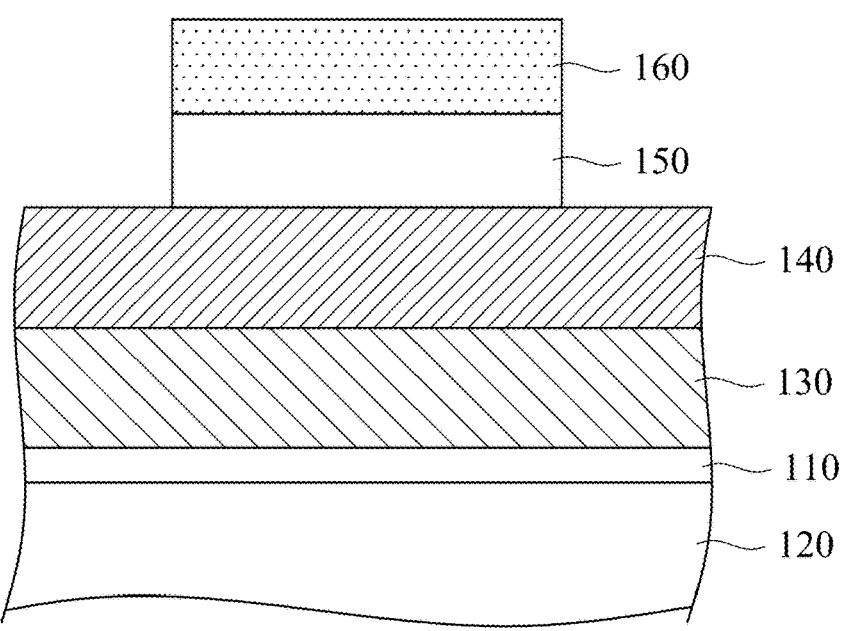
FIGS. 2 to 9 are cross-sectional views at intermediate stages of a method of forming a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method of forming a semiconductor structure according to one embodiment of the present disclosure. The method of forming the semiconductor structure includes the following steps. In step S1, a semiconductor layer and a metal layer are formed on a first dielectric layer on a semiconductor substrate in sequence. Thereafter, in step S2, a second dielectric layer is formed on a portion of the metal layer. Next, in step S3, a boro-phospho-silicate-glass (BPSG) layer is formed on the second dielectric layer.

Afterwards, in step S4, the metal layer and the semiconductor layer are etched using the BPSG layer as a mask. Subsequently, in step S5, a first spacer layer is formed on a sidewall of the semiconductor layer, a sidewall of the metal layer, a sidewall of the second dielectric layer, and a top surface of the BPSG layer. Thereafter, in step S6, the first spacer layer is etched to expose the BPSG layer. Next, in step S7, the BPSG layer is removed to expose a top surface of the second dielectric layer. Afterwards, in step S8, a second spacer layer is formed on a sidewall of the first spacer layer and the top surface of the second dielectric layer. Subsequently, in step S9, the second spacer layer is etched to expose the top surface of the second dielectric layer.

Moreover, each of steps S1 to S9 may include plural detailed steps, the method may include other steps between step S1 and step S9, and the method may include other steps before step S1 and after step S9. In the following description, the aforementioned steps S1 to S9 will be described.

FIGS. 2 to 9 are cross-sectional views at intermediate stages of a method of forming a semiconductor structure according to some embodiments of the present disclosure. As shown in FIG. 2, a first dielectric layer 110 is formed on a semiconductor substrate 120. The material of the first dielectric layer 110 may include silicon dioxide ($SiO_2$), and the first dielectric layer 110 may be formed by in-situ steam generation (ISSG). A semiconductor layer 130 and a metal layer 140 are formed on the first dielectric layer 110 in sequence. The material of the semiconductor layer 130 may include polysilicon, and the material of the metal layer 140 may be tungsten (W). The semiconductor substrate 120 may be a silicon substrate. The semiconductor layer 130 is below the metal layer 140, and the semiconductor layer 130 is located between the metal layer 140 and the first dielectric layer 110.

Thereafter, a second dielectric layer 150 is formed on a portion of the metal layer 140, and then a boro-phospho-silicate-glass (BPSG) layer 160 is formed on the second dielectric layer 150. The second dielectric layer 150 and the BPSG layer 160 may be formed by photolithography patterning processes. The second dielectric layer 150 is located between the BPSG layer 160 and the metal layer 140. In addition, the material of the second dielectric layer 150 is different from the material of the first dielectric layer 110. In some embodiments, the material of the second dielectric layer 150 may be nitride, such as carbon nitride.

Figure 3:
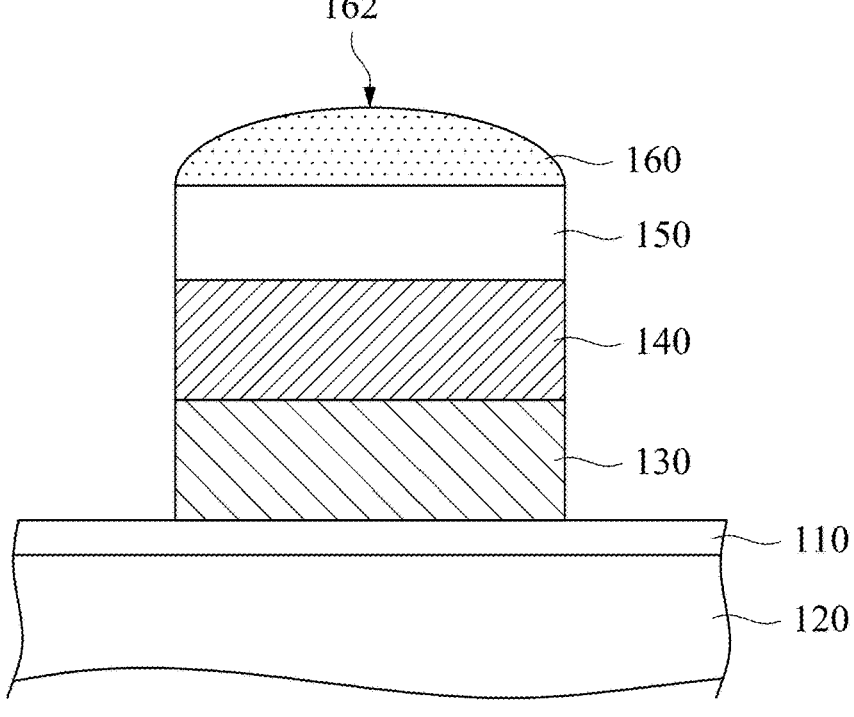

Referring to FIG. 3, after the formation of the BPSG layer 160, the metal layer 140 and the semiconductor layer 130 can be etched using the BPSG layer 160 as a mask. After the etching process, the top surface 162 of the BPSG layer 160 is convex because of consuming a portion of the BPSG layer 160 during the etching. In addition, the metal layer 140 is a gate electrode, and the structure of FIG. 3 over the semiconductor substrate 120 is referred to as a gate stack.

Figure 4:
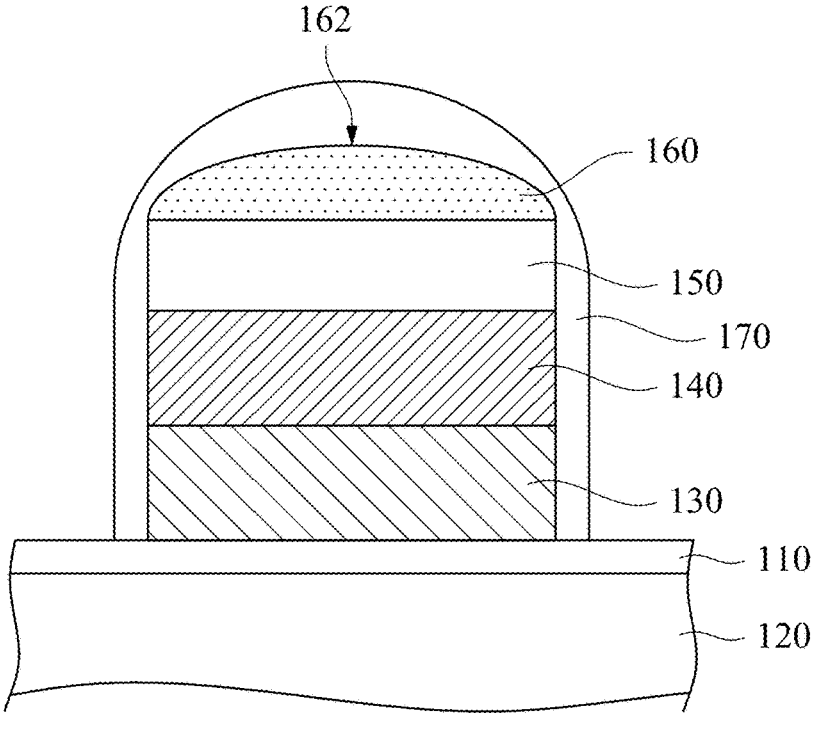

Referring to FIG. 4, thereafter, a first spacer layer 170 is formed on the sidewall of the semiconductor layer 130, the sidewall of the metal layer 140, the sidewall of the second dielectric layer 150, and the top surface 162 of the BPSG layer 160. In some embodiments, the material of the first spacer layer 170 is the same as the material of the second dielectric layer 150, such as nitride.

Figure 5:
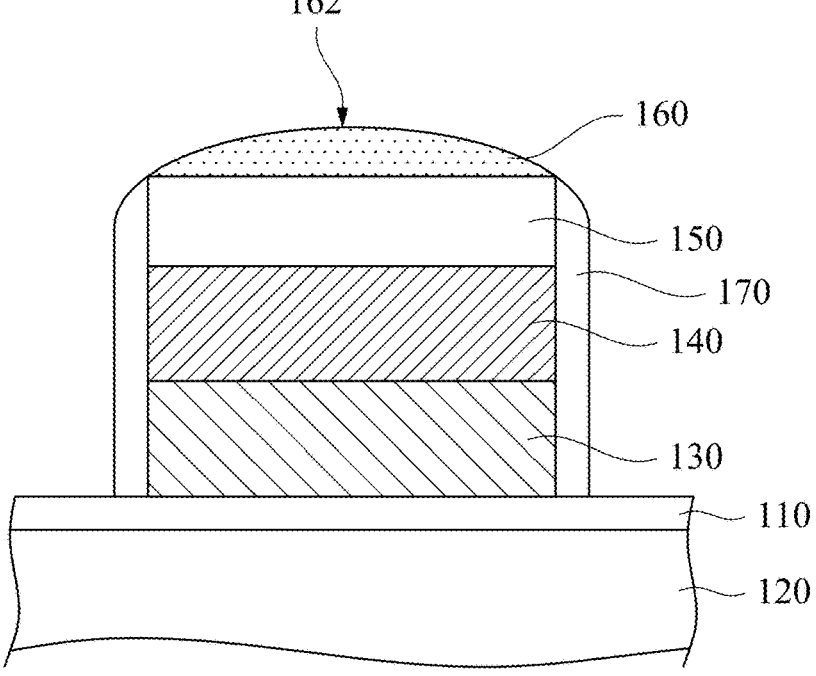

Referring to FIG. 5, after the formation of the first spacer layer 170, the first spacer layer 170 is etched to expose the BPSG layer 160. In other words, there is no first spacer layer 170 on the top surface 162 of the BPSG layer 160.

Figure 6:
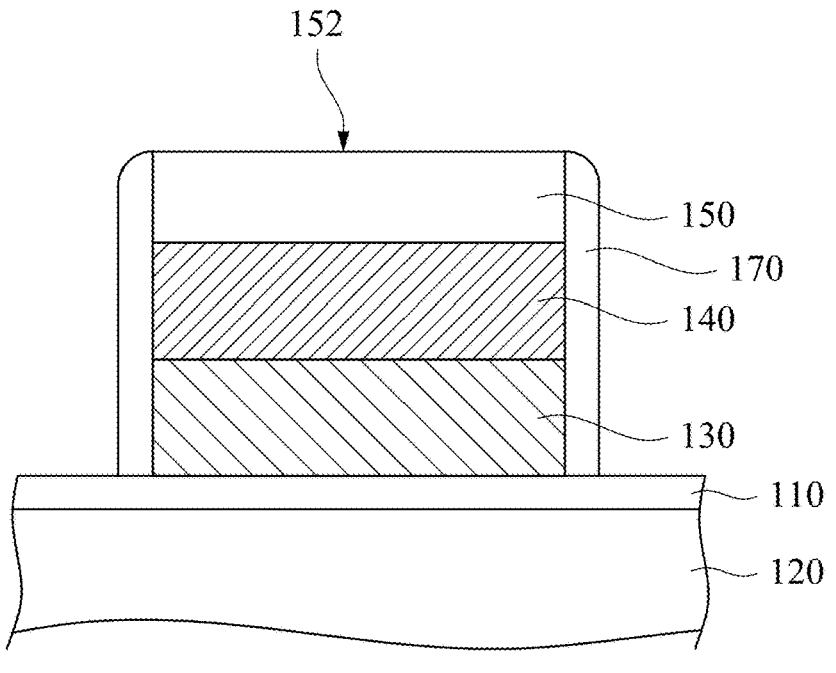

Referring to FIG. 6, thereafter, the BPSG layer 160 is removed to expose a top surface 152 of the second dielectric layer 150. The removal of the BPSG layer 160 may be performed by wet etch. In some embodiments, the BPSG layer 160 has a different etch selectivity from the first dielectric layer 110, and thus the first dielectric layer 110 remains after etching the BPSG layer 160.

Figure 7:
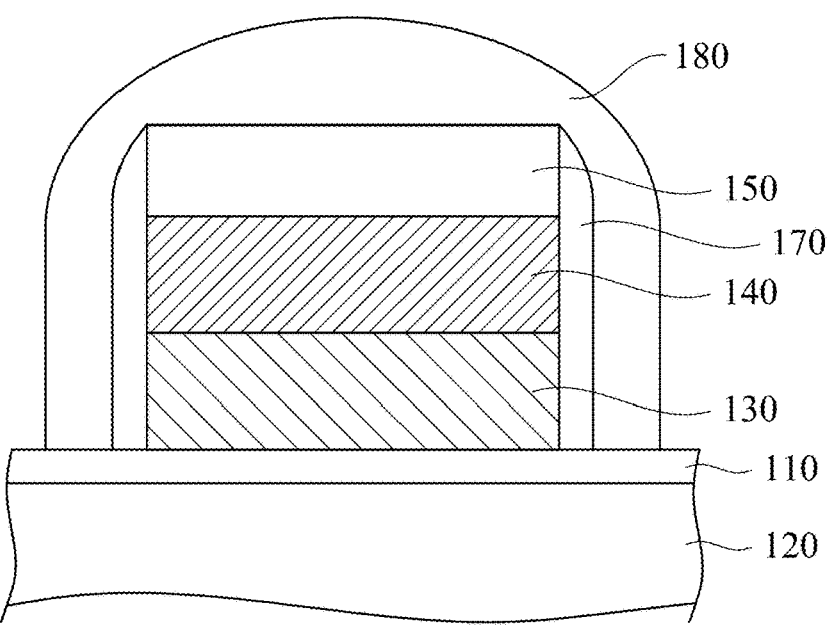

Referring to FIG. 7, after the BPSG layer 160 is removed from the top surface 152 of the second dielectric layer 150, a second spacer layer 180 is formed on the sidewall of the first spacer layer 170 and the top surface 152 of the second dielectric layer 150. The material of the second spacer layer 180 is different from the material of the first spacer layer 170. For example, the second spacer layer 180 may be oxide. In this step, the second spacer layer 180 is in direct contact with the top surface 152 of the second dielectric layer 150.

Figure 8:
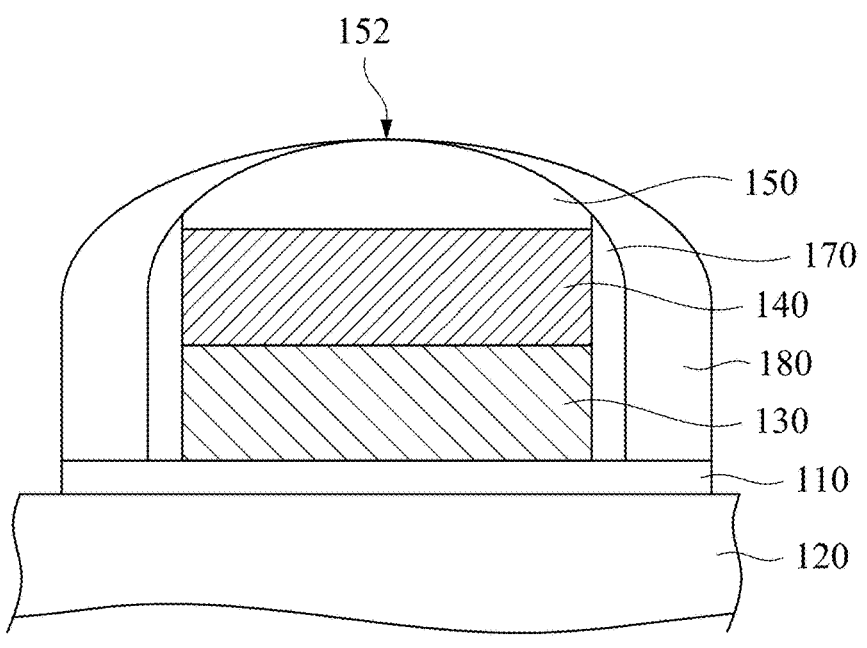

Referring to FIG. 8, thereafter, the second spacer layer 180 is etched to expose the top surface 152 of the second dielectric layer 150, and thus a gate structure shown in FIG. 8 can be obtained. During etching the second spacer layer 180, the top surface 152 of the second dielectric layer 150 can be detected whether it is exposed. Furthermore, when the top surface of the second dielectric layer is detected to be exposed, etching the second spacer layer 180 is stopped. Etching process time is based on end point detection (EPD) to the second dielectric layer 150. In addition, the top surface 152 of the second dielectric layer 150 is convex because of consuming a portion of the second dielectric layer 150 during the etching.

Specifically, since the BPSG layer 160 (see FIG. 5) is formed on the second dielectric layer to replace a traditional oxide layer, the BPSG layer 160 can be removed to expose the top surface 152 of the second dielectric layer 150 after etching the first spacer layer 170 (see FIG. 5). As a result, the second spacer layer 180 can be directly formed on the top surface 152 of the second dielectric layer 150 and the sidewall of the first spacer layer 170. There is no additional oxide layer directly below the second spacer layer 180 before etching the second spacer layer 180 and having the same material as the second spacer layer 180, end point detection (EPD) for controlling etching process time can be stable based on the thickness of the second spacer layer 180. Therefore, the thickness of the remaining second spacer layer 180 is easily controlled.

Figure 9:
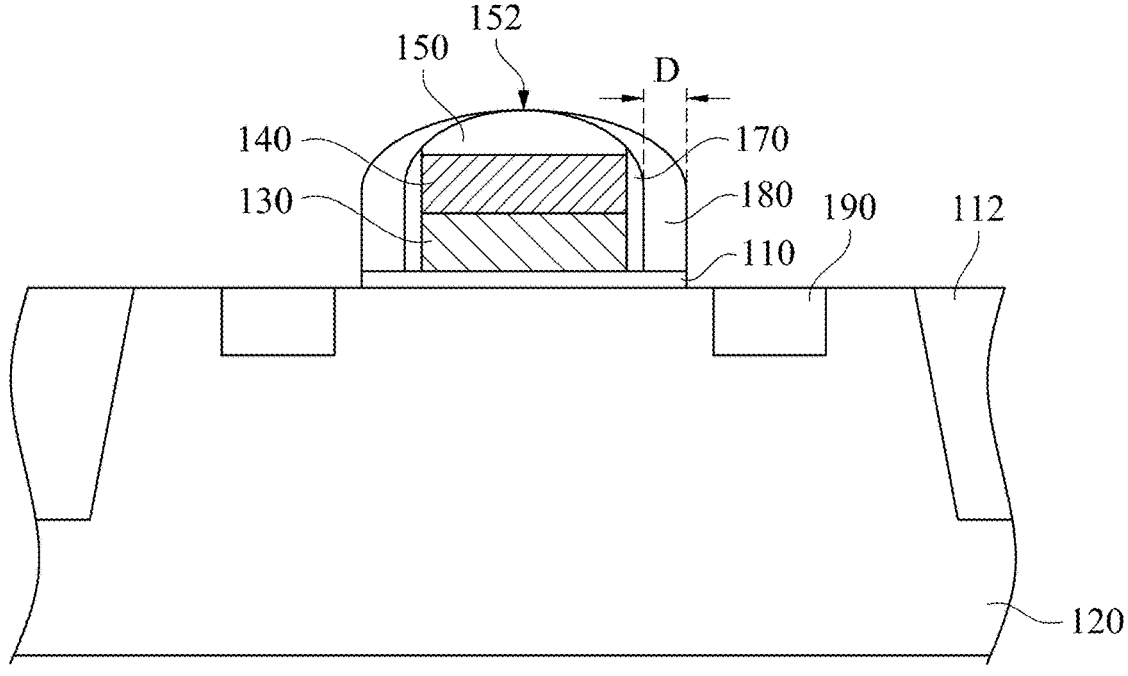

Referring to FIG. 9, after the second spacer layer 180 is etched to expose the top surface 152 of the second dielectric layer 150, the second spacer layer 180 has a thickness D. The thickness D of the second spacer layer 180 is a critical dimension (CD) to determine positions for forming source/drain regions 190. The source/drain region 190 can be formed in a position of the semiconductor substrate 120 based on the thickness D of the second spacer layer 180. In other words, the thickness D of the remaining second spacer layer 180 is easily controlled, thereby defining stable positions for source/drain regions' implant, which results in good electrical properties, such as saturation current (Idsat). In some embodiments, the source/drain region 190 is located between the channel region and the shallow trench isolation (STI) 112 of the semiconductor substrate 120, in which the channel region is below the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming a semiconductor layer and a metal layer on a first dielectric layer on a semiconductor substrate in sequence;
   forming a second dielectric layer on a portion of the metal layer;
   forming a boro-phospho-silicate-glass (BPSG) layer on the second dielectric layer;
   etching the metal layer and the semiconductor layer using the BPSG layer as a mask;
   forming a first spacer layer on a sidewall of the semiconductor layer, a sidewall of the metal layer, a sidewall of the second dielectric layer, and a top surface of the BPSG layer;
   etching the first spacer layer to expose the BPSG layer;
   removing the BPSG layer to expose a top surface of the second dielectric layer;
   forming a second spacer layer on a sidewall of the first spacer layer and the top surface of the second dielectric layer; and
   etching the second spacer layer to expose the top surface of the second dielectric layer.

2. The method of forming the semiconductor structure of claim 1, wherein the BPSG layer has a different etch selectivity from the first dielectric layer.

3. The method of forming the semiconductor structure of claim 1, wherein a material of the first dielectric layer comprises silicon dioxide, and the first dielectric layer is formed by in-situ steam generation (ISSG).

4. The method of forming the semiconductor structure of claim 1, wherein the top surface of the BPSG layer is convex after etching the metal layer and the semiconductor layer.

5. The method of forming the semiconductor structure of claim 1, wherein forming the second spacer layer on the sidewall of the first spacer layer and the top surface of the second dielectric layer is performed such that the second spacer layer is in direct contact with the top surface of the second dielectric layer.

6. The method of forming the semiconductor structure of claim 1, wherein a material of the second dielectric layer is different from a material of the first dielectric layer.

7. The method of forming the semiconductor structure of claim 1, wherein a material of the first spacer layer is different from a material of the second spacer layer.

8. The method of forming the semiconductor structure of claim 1, wherein a material of the first spacer layer is the same as a material of the second dielectric layer.

9. The method of forming the semiconductor structure of claim 1, further comprising:
   detecting whether the top surface of the second dielectric layer is exposed during etching the second spacer layer; and
   stopping etching the second spacer layer when detecting the top surface of the second dielectric layer is exposed.

10. The method of forming the semiconductor structure of claim 1, further comprising:
   forming a source/drain region in a position of the semiconductor substrate based on a thickness of the second spacer layer.

11. The method of forming the semiconductor structure of claim 1, wherein a material of the semiconductor layer comprises polysilicon.

12. A method of forming a semiconductor structure, comprising:

etching a metal layer and a semiconductor layer below the metal layer using a boro-phospho-silicate-glass (BPSG) layer as a mask, wherein the semiconductor layer is located between the metal layer and a first dielectric layer, and a second dielectric layer is located between the BPSG layer and the metal layer;

forming a first spacer layer on a sidewall of the semiconductor layer, a sidewall of the metal layer, a sidewall of the second dielectric layer, and a top surface of the BPSG layer;

etching the first spacer layer to expose the BPSG layer;

removing the BPSG layer to expose a top surface of the second dielectric layer, wherein the BPSG layer has a different etch selectivity from the first dielectric layer;

forming a second spacer layer on a sidewall of the first spacer layer and the top surface of the second dielectric layer; and etching the second spacer layer to expose the top surface of the second dielectric layer.

13. The method of forming the semiconductor structure of claim 12, wherein a material of the first dielectric layer comprises silicon dioxide, and the first dielectric layer is formed by in-situ steam generation (ISSG).

14. The method of forming the semiconductor structure of claim 12, wherein the top surface of the BPSG layer is convex after etching the metal layer and the semiconductor layer.

15. The method of forming the semiconductor structure of claim 12, wherein forming the second spacer layer on the sidewall of the first spacer layer and the top surface of the second dielectric layer is performed such that the second spacer layer is in direct contact with the top surface of the second dielectric layer.

16. The method of forming the semiconductor structure of claim 12, wherein a material of the second dielectric layer is different from a material of the first dielectric layer.

17. The method of forming the semiconductor structure of claim 12, wherein a material of the first spacer layer is different from a material of the second spacer layer.

18. The method of forming the semiconductor structure of claim 12, wherein a material of the first spacer layer is the same as a material of the second dielectric layer.

19. The method of forming the semiconductor structure of claim 12, further comprising:

detecting whether the top surface of the second dielectric layer is exposed during etching the second spacer layer; and stopping etching the second spacer layer when detecting the top surface of the second dielectric layer is exposed.

20. The method of forming the semiconductor structure of claim 12, further comprising:

forming a source/drain region in a position of a semiconductor substrate based on a thickness of the second spacer layer.

* * * * *